(12) United States Patent
Liu et al.

(10) Patent No.: US 7,892,900 B2
(45) Date of Patent: Feb. 22, 2011

(54) INTEGRATED CIRCUIT SYSTEM EMPLOYING SACRIFICIAL SPACERS

(75) Inventors: Huang Liu, Singapore (SG); Wei Lu, Singapore (SG); Hai Cong, Singapore (SG); Alex K. H. See, Singapore (SG); Hui Peng Koh, Singapore (SG); Meisheng Zhou, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 429 days.

(21) Appl. No.: 12/098,751

(22) Filed: Apr. 7, 2008

(65) Prior Publication Data

US 2009/0250762 A1  Oct. 8, 2009

(51) Int. Cl.
*H01L 21/00* (2006.01)
*H01L 21/84* (2006.01)
*H01L 21/336* (2006.01)

(52) U.S. Cl. ...................... 438/154; 438/303

(58) Field of Classification Search ......... 438/149–155, 438/299–309, E21.339, E21.64
See application file for complete search history.

(56) References Cited

U.S. PATENT DOCUMENTS 6,559,017 B1    5/2003  Brown et al.
6,833,320 B2   12/2004  Meagley et al.
7,105,431 B2    9/2006  Yin et al.
7,126,198 B2   10/2006  Steiner et al.
7,279,419 B2   10/2007  Kim et al.
7,696,036 B2 *  4/2010  Bu et al. ..................... 438/303
7,737,510 B2 *  6/2010  Akamatsu .................... 257/408
7,772,051 B2 *  8/2010  Lo ............................. 438/149

* cited by examiner

*Primary Examiner*—Cuong Q Nguyen
(74) *Attorney, Agent, or Firm*—Mikio Ishimaru

(57) ABSTRACT

An integrated circuit system that includes: providing a substrate including a first device and a second device; configuring the first device and the second device to include a first spacer, a first liner made from a first dielectric layer, and a second spacer made from a sacrificial spacer material; forming a second dielectric layer over the integrated circuit system; forming a first device source/drain and a second device source/drain adjacent the second spacer and through the second dielectric layer; removing the second spacer without damaging the substrate; forming a third dielectric layer over the integrated circuit system before annealing; and forming a fourth dielectric layer over the integrated circuit system that promotes stress within the channel of the first device, the second device, or a combination thereof.

20 Claims, 5 Drawing Sheets

INTEGRATED CIRCUIT SYSTEM EMPLOYING SACRIFICIAL SPACERS

TECHNICAL FIELD

The present invention relates generally to integrated circuits, and more particularly to an integrated circuit system employing sacrificial spacers.

BACKGROUND ART

Integrated circuits find application in many of today's consumer electronics, such as cell phones, video cameras, portable music players, printers, computers, etc. Integrated circuits may include a combination of active devices, passive devices and their interconnections.

Active devices, such as a metal-oxide-semiconductor field-effect transistor (MOSFET), generally include a semiconductor substrate, having a source, a drain, and a channel located between the source and drain. A gate stack composed of a conductive material (i.e., a gate) and an oxide layer (i.e., a gate oxide) are typically located directly above the channel. During operation, an inversion layer forms a conducting bridge or "channel" between the source and drain when a voltage is applied to the gate. Both p-channel and n-channel MOSFET technologies are available and can be combined on a single substrate in one technology, called complementary-metal-oxide-semiconductor or CMOS.

Scaling of the MOSFET, whether by itself or in a CMOS configuration, has become a major challenge for the semiconductor industry. Size reduction of the integral parts of a MOSFET has lead to improvements in device operation speed and packing density, but size reduction has its limits. For example, spacing between adjacent gate structures has been rapidly shrinking with transistor scaling and conventional spacer integration schemes. Unfortunately, the physical spacing left after conventional spacer formation between current-era adjacent gate structures is so small that challenges arise for pre-metal dielectric gap-fill, strain induced layer deposition, and contact masking and etching. Solutions to the beforementioned problems have included the use of a disposable spacer, but unfortunately removal of the disposable spacer causes damage to underlying silicon and silicide layer due to required etch processes. Consequently, new methods must be developed to maintain the expected device performance enhancement from one generation of devices to the next.

Thus, a need still remains for a reliable integrated circuit system and method of fabrication, wherein the integrated circuit system allows removal of material between adjacent gate structures without damage to underlying layers. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate including a first device and a second device; configuring the first device and the second device to include a first spacer, a first liner made from a first dielectric layer, and a second spacer made from a sacrificial spacer material; forming a second dielectric layer over the integrated circuit system; forming a first device source/drain and a second device source/drain adjacent the second spacer and through the second dielectric layer; removing the second spacer without damaging the substrate; forming a third dielectric layer over the integrated circuit system before annealing; and forming a fourth dielectric layer over the integrated circuit system that promotes stress within the channel of the first device, the second device, or a combination thereof.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
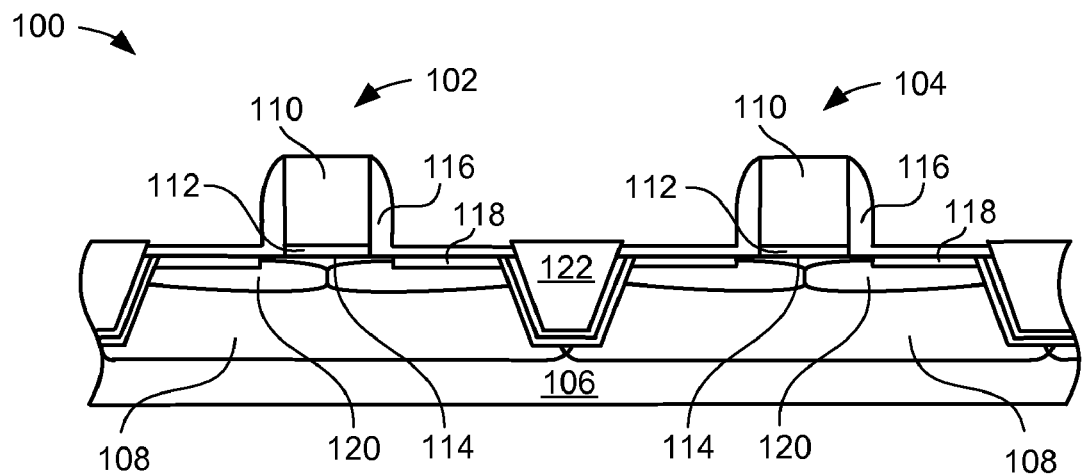
FIG. 1 is a partial cross sectional view of an integrated circuit system in an initial stage of manufacture in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, implanting, etching, cleaning, and/or removal of the material or photoresist as required in forming a described structure.

The terms "example" or "exemplary" are used herein to mean serving as an instance or illustration. Any aspect or embodiment described herein as an "example" or as "exemplary" is not necessarily to be construed as preferred or advantageous over other aspects, embodiments, or designs.

The terms "first", "second", "third", "fourth", and "fifth" as used herein are for purposes of differentiation between elements only and are not to be construed as limiting the scope of the present invention.

The term "on" is used herein to mean there is direct contact among elements.

The term "system" as used herein means and refers to the method and to the apparatus of the present invention in accordance with the context in which the term is used.

The term "stress inducing layer" as used herein includes one or more materials or layers that affects the physical properties, such as carrier mobility, of an adjacent structure or element.

The term "sacrificial spacer material" as used herein includes one or more materials or layers that can be removed without causing damage to underlying layers (e.g., no active region silicon loss).

FIGS. 1-13, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-13. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of multi-electrode devices in which the current flowing between two specified electrodes is controlled or modulated by the voltage applied at a control electrode. Exemplary illustrations may include an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor. Additionally, it is to be understood that the integrated circuit system of the present disclosure may also include any number of resistance devices with varying resistance values formed by strategically altering the process techniques. Furthermore, it is to be understood that one or more of the integrated circuit system could be prepared at one time on a medium, which could be separated into individual or multiple integrated circuit assemblies at a later stage of fabrication.

Generally, the following embodiments relate to the formation of an integrated circuit system including, but not limited to, an active device structure with strategically engineered sacrificial spacers whose removal does not damage underlying layers.

Referring now to FIG. 1, therein is shown a partial cross sectional view of an integrated circuit system 100 in an initial stage of manufacture in accordance with an embodiment of the present invention. In some embodiments, the integrated circuit system 100 may include a first device 102 and a second device 104. In such cases, the first device 102 and the second device 104 may more particularly include, for example, active devices, such as NFET devices, PFET devices and/or a combination thereof (e.g., a CMOS device structure). In other cases, the first device 102 and the second device 104 may also include one or more passive devices, such as resistors. In yet other cases, the first device 102 and the second device 104 may include a combination of active and passive devices acting in concert or independently. However, it is to be understood that the first device 102 and the second device 104 are not limited to the preceding examples and may include any number of active devices, passive devices, or any combination thereof.

Additionally, although the embodiments described herein are presented for forming first and second adjacent devices, it is to be understood that the methods may also be used to form a single discrete device.

Moreover, it is to be understood that the integrated circuit system 100 manufactured by the embodiments described herein can be used within a multitude of electronic systems, such as processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

In some embodiments, the first device 102 and the second device 104 can be formed over, on and/or within a substrate 106 by conventional deposition, patterning, photolithography, and etching techniques known in the semiconductor processing industry for the manufacture of active devices. By way of example, the substrate 106 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 106 may also include doped and undoped configurations, epitaxial layers, strained configurations, and one or more crystal orientations (e.g., <100>, <110>, and/or <111> orientations), which may be strategically employed to optimize carrier mobility within NFET and/or PFET devices. The substrate 106 may also include any material that becomes amorphous upon implantation.

In some embodiments, the substrate 106 may possess a thickness ranging from about one hundred (100) nanometers to about several hundred microns, for example.

However, the examples provided for the substrate 106 are not to be construed as limiting and the composition of the substrate 106 may include any surface, material, configuration, or thickness that physically and electrically enables the formation of active and/or passive device structures.

In general, the first device 102 and the second device 104 both include a well 108, a gate 110, a gate dielectric 112, a channel 114, a first spacer 116, a source/drain extension 118, and a halo region 120.

It is to be understood that each of the well 108 can be formed within the substrate 106 prior to or subsequent to the formation of the gate 110 and the gate dielectric 112, depending upon, for example, the desired dopant concentration within the channel 114. Generally, the dopants used to form each of the well 108 are of opposite conductivity type as compared to the dopants used to form the source/drain extension 118, i.e., p-type impurities for NFET devices and n-type impurities for PFET devices. It is to be understood that the depth, dopant concentration, and energy used to form the well 108 can depend upon the dopant used and the design specifications of the first device 102 and the second device 104.

In some embodiments, the gate 110 may be formed from conventional materials including doped and undoped semiconducting materials (such as, for example, polySi, amorphous Si, or SiGe), a metal, a metallic alloy, a silicide, or a combination thereof, for example. In other embodiments, the gate 110 may also include any conducting material or composition that becomes amorphous upon implantation. Regardless of the composition of the gate 110, the gate 110 may include a critical dimension, i.e., a cross-sectional width, of 45 nanometers or less. The gate dielectric 112 may be made from materials including, but not limited to, silicon oxide, silicon oxynitride, silicon nitride, a silicon oxide/nitride/oxide stack, a high-k dielectric material (i.e.—one having a dielectric constant value greater than silicon oxide), or a combination thereof. However, it is to be understood that the type of material chosen for the gate dielectric 112 is not limited to the above examples; for example, the gate dielectric 112 may include any material that permits induction of a charge in the channel 114 when an appropriate voltage is applied to the gate 110. Accordingly, other materials, which may be known to those skilled in the art for gate structures, may also be used for the gate 110 and the gate dielectric 112.

Generally, the thickness of the gate 110 is between about 500 angstroms and about 3000 angstroms and the thickness of the gate dielectric 112 is between about 10 angstroms and about 50 angstroms. However, larger or smaller thicknesses of the gate 110 and the gate dielectric 112 may be appropriate depending on the design specifications of the first device 102 and the second device 104.

Generally, the first spacer 116 may be formed from the deposition and anisotropic etching of conventional dielectric materials such as an oxide, a nitride, or a combination thereof. In some embodiments, the first spacer 116 can be formed from the deposition and anisotropic etching of silicon oxide. However, it is to be understood that the type of materials chosen for the first spacer 116 are not limited to the above examples and may include any material that permits electrical isolation of the gate 110 and formation of the source/drain extension 118 aligned to the first spacer 116. By way of example, the first spacer 116 can be formed by a variety of techniques, including, but not limited to, physical vapor deposition, chemical vapor deposition and thermal oxidation, followed by an appropriate anisotropic etch.

Generally, the thickness and/or width of the first spacer 116 at its interface with the substrate 106 can vary between about 50 angstroms and about 500 angstroms. In a preferred aspect of the embodiment, the thickness and/or width of the first spacer 116 at its interface with the substrate 106 can vary between about 80 angstroms and about 200 angstroms. However, it is to be understood that the thickness of the first spacer 116 can vary with the design specifications of the first device 102 and the second device 104, such as, but not limited to, critical dimension scaling, placement of the source/drain extension 118 and/or placement of the halo region 120. Moreover, it is to be understood that the thickness of the first spacer 116 may include without limitation any thickness that is optimized to strategically affect the formation of subsequently formed source and drain regions, source and drain contact formations, and/or the proximity of a subsequently deposited stress inducing layer (i.e., a layer that can enhance carrier mobility within the channel region of an active device).

The first device 102 and the second device 104 may also include the source/drain extension 118 formed adjacent the gate 110 and optionally aligned to the first spacer 116. In general, the source/drain extension 118 may be formed to a shallow depth with a low concentration of impurities relative to a source and drain region.

The impurities used to form the source/drain extension 118 may include n-type or p-type, depending on the first device 102 and/or the second device 104 being formed (e.g., n-type impurities for an NMOS device and p-type impurities for a PMOS device). Typically, the impurities used to form the source/drain extension 118 are of the same conductivity type as the impurities used to form a source and drain region. It is to be understood that the source/drain extension 118 can be formed via an angled or perpendicular, with respect to the conventional surface of the substrate 106, implant that can be aligned to the gate 110 or the first spacer 116.

A halo implant can help to decrease the length of the channel 110, which may be advantageous for minimizing punchthrough current and short channel effects, thereby helping to improve the performance of the first device 102 and the second device 104. In general, the halo region 120 can be formed by implanting impurities adjacent the gate 110 and/or the first spacer 116. In some embodiments, the halo region 120 can be formed by implanting the substrate 106 with impurities of opposite conductivity type to that of the impurities used to form the source/drain extension 118 and a source and drain region. For example, if the source/drain extension 118 and the source and drain region are formed with n-type impurities then the halo region 120 can be formed with p-type impurities.

The halo dopant material is typically implanted at an angle so that the dopant material can be implanted underneath the gate 110 and the first spacer 116. In general, the angle of the implantation is typically substantially less than ninety degrees relative to the conventional surface of the substrate 106, e.g., between about fifteen to about seventy-five degrees relative to the surface of the substrate 106. In some embodiments, the substrate 106 can be rotated during the angled halo implantation to provide symmetrical forms of the halo region 120, i.e., to form dual and quad halo implant regions. However, in other embodiments, the halo dopant implant may be implanted perpendicular to the conventional surface of the substrate 106.

In some embodiments, an isolation structure 122, such as a shallow trench isolation structure, can electrically isolate and/or separate the first device 102, the second device and other structures from each other. For purposes of illustration, the isolation structure 122 may be made from a dielectric material such as silicon dioxide ("$SiO_2$").

Figure 2:
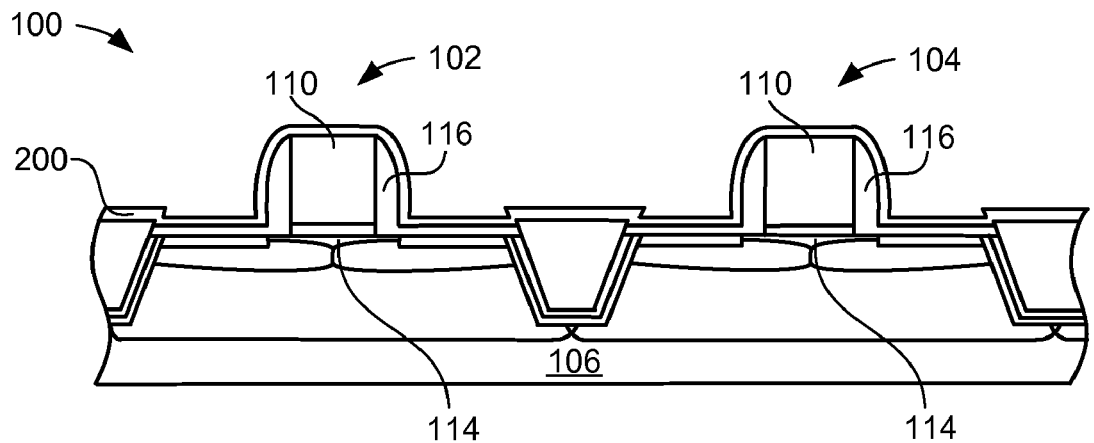
FIG. 2 is the structure of FIG. 1 after forming a first dielectric layer.

Referring now to FIG. 2, therein is shown the structure of FIG. 1 after forming a first dielectric layer 200. The first dielectric layer 200 can be formed over the entirety or on selected portions of the integrated circuit system 100, e.g., blanket deposited over or on the substrate 106, the first spacer 116, and the gate 110, each of the first device 102 and the second device 104. In general, the first dielectric layer 200 can be formed by a variety of techniques, including, but not limited to, chemical vapor deposition and physical vapor deposition.

In some embodiments, the first dielectric layer 200 may include an insulating material such as a nitride deposited by low pressure chemical vapor deposition (LPCVD) or plasma enhanced chemical vapor deposition (PECVD). In other embodiments, the first dielectric layer 200 may include a silicon nitride film deposited by rapid thermal chemical vapor deposition (RTCVD). In general, the first dielectric layer 200 may have a thickness ranging from about 50 angstroms to about 100 angstroms. However, larger or smaller thicknesses may be employed depending upon the design specifications of the first device 102 and the second device 104.

In yet other embodiments, the first dielectric layer 200 may include any material, such as a stress inducing layer, that transfers its inherent or intrinsic stress to the gate 110, the channel 114, and/or the source and drain of the first device 102 and/or the second device 104. By way of example, the first dielectric layer 200 may include a compressively stressed layer or a tensile stressed layer.

It is to be understood that the stress induced within the first device 102 and/or the second device 104 by the first dielectric layer 200 can be increased by altering the intrinsic stress within the first dielectric layer 200. For example, a multitude of deposition parameters, such as reactant flow rates, pressure, temperature, RF power, reactant materials, and thickness, can be adjusted to modulate the intrinsic stress within the first dielectric layer 200 and thereby maximize its stress transference effect upon the first device 102 and/or the second device 104. In an embodiment, the first dielectric layer 200 may include a silicon nitride layer deposited by a plasma enhanced chemical vapor deposition process.

Figure 3:
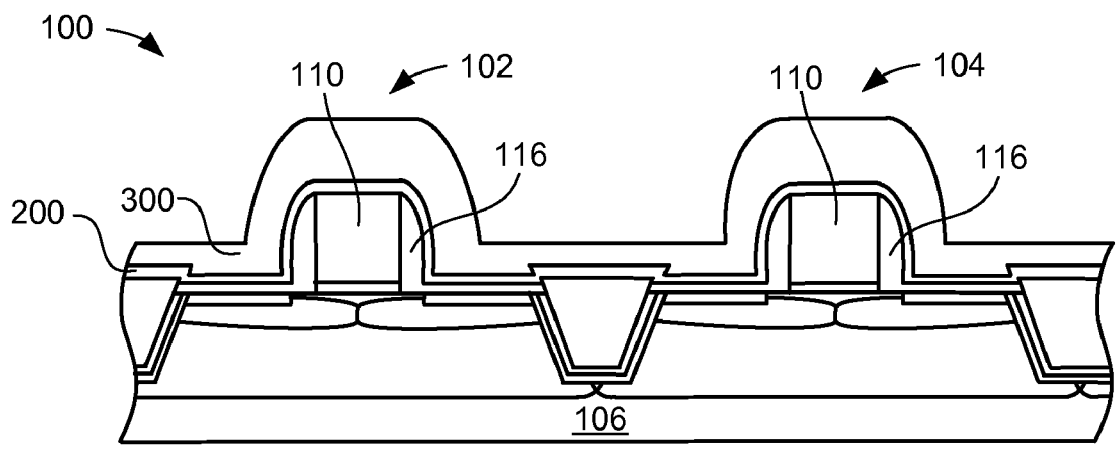
FIG. 3 is the structure of FIG. 2 after forming a sacrificial spacer material.

In yet other embodiments, the first dielectric layer 200 may be formed of a material that can be selectively etched with respect to a sacrificial spacer material 300, of FIG. 3. By forming the first dielectric layer 200 from a material that possesses a differential etch characteristic with respect to the sacrificial spacer material 300, damage to the gate 110 of the first device 102 and the second device 104 can be diminished or prevented during the removal of the sacrificial spacer material 300.

Referring now to FIG. 3, therein is shown the structure of FIG. 2 after forming the sacrificial spacer material 300. The sacrificial spacer material 300 can be formed over or on the entirety or selected portions of the integrated circuit system 100, e.g., blanket deposited over or on the first dielectric layer 200, which can be over or on the substrate 106, the first spacer 116, and the gate 110, each of the first device 102 and the second device 104. In general, the sacrificial spacer material 300 can be formed by a variety of techniques, including, but not limited to, chemical vapor deposition and spin-on coating followed by baking.

By way of example, the sacrificial spacer material 300 may have a thickness ranging from about 200 angstroms to about 800 angstroms. However, larger or smaller thicknesses may be employed depending upon the design specifications of the first device 102 and the second device 104.

Generally, the sacrificial spacer material 300 may include any material that prevents damage to the integrated circuit system 100 (e.g., the substrate 106) during removal of the sacrificial spacer material 300. In some embodiments, the sacrificial spacer material 300 may include organic materials, such as amorphous carbon, for example. In some cases the amorphous carbon can be deposited by chemical vapor deposition techniques, such as plasma enhanced chemical vapor deposition. By way of example, the amorphous carbon can be deposited utilizing alkanes, alkenes, and alkynes of two and three carbon chains, at strategically determined temperatures, pressures, flow rates, energies, and/or dopant doses, so as to form the sacrificial spacer material 300 such that it can be removed without causing damage to the integrated circuit system 100 (e.g., the substrate 106). In other embodiments, the sacrificial spacer material 300 may also include any organic material that is removable by $O_2$ ashing.

However, it is to be understood that the above parameters and materials are not limiting and those skilled in the art will appreciate that additional parameters and materials may also be employed/manipulated to effectuate the purpose of preventing damage to the integrated circuit system 100 during removal of the sacrificial spacer material 300. Generally, spacers including amorphous carbon are easier to integrate and remove than conventional oxide and/or nitride spacers because the carbon containing compounds exhibit a high etch selectivity to silicon oxide, silicon nitride and poly-silicon with easy strippability when employing ashing processes.

In yet other embodiments, the sacrificial spacer material 300 may include a thermally decomposable material, for example. In some cases the thermally decomposable material can be deposited by spin-on coating followed by baking. Generally, the thermally decomposable material may include a combination of organic and inorganic materials, moieties, and/or species, such as silicon containing and carbonaceous materials, that can be removed without causing damage to the integrated circuit system 100 (e.g., the substrate 106). In such cases, the thermally decomposable material may include hydrocarbon-siloxane polymer hybrid, for example. The siloxane portion of the polymer may include polysiloxane with an oligopolyolefin, oligopolycyclolefin, oligopolyarylolefin, or oligopolycarbonate graft, and combinations thereof. The siloxane portion of the polymer may also include polyolefin, polycyclolefin, oligopolyarylolefin, or oligopolycarbonate, or combinations thereof, with an oligosiloxane graft. In other cases, the thermally decomposable material may include inorganic polymers or oligomers, such as silsesquioxanes, hydrosilsesquioxanes, and carboranes.

However, it is to be understood that the above examples are not limiting and those skilled in the art will appreciate that additional materials may also be employed/manipulated to effectuate the purpose of preventing damage to the integrated circuit system 100 during removal of the thermally decomposable material, i.e., the sacrificial spacer material 300.

Figure 4:
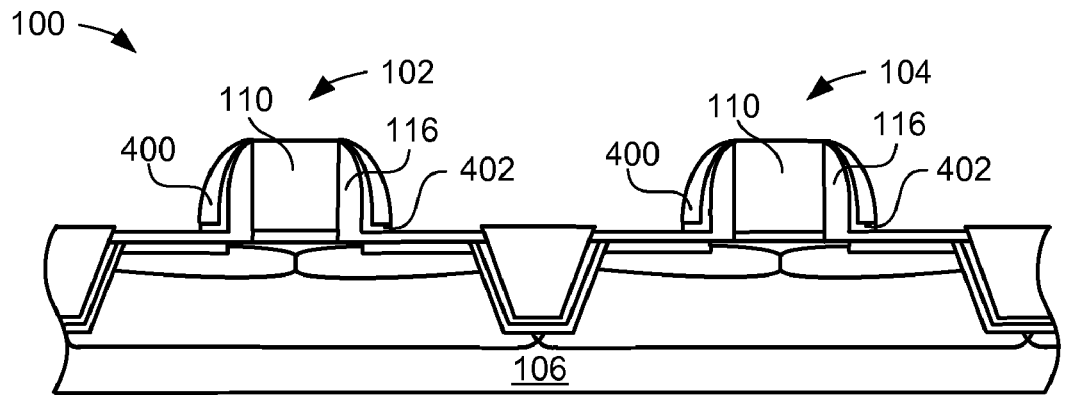
FIG. 4 is the structure of FIG. 3 after forming a second spacer and a first liner.

Referring now to FIG. 4, therein is shown the structure of FIG. 3 after forming a second spacer 400 and a first liner 402. The first liner 402 can be formed adjacent the first spacer 116 of both of the first device 102 and the second device 104 and the second spacer 400 can be formed adjacent the first liner 402 of both of the first device 102 and the second device 104. In general, it is to be understood that the second spacer 400 can be formed by removing selected portions of the sacrificial spacer material 300, of FIG. 3, and the first liner 402 can be formed by removing selected portions of the first dielectric layer 200, of FIG. 3.

In some embodiments, the second spacer 400 can be formed by an appropriate anisotropic etch process that removes material of the sacrificial spacer material 300 from over horizontal portions of the substrate 106 and the top of the first device 102 and the second device 104, thereby exposing portions of the first dielectric layer 200 formed over the substrate 106 and the top of the first device 102 and the second device 104.

In other embodiments, the spacer etch process used to form the second spacer 400 may include any etch process that can selectively etch the material of the sacrificial spacer material 300 with respect to the material of the first liner 402. However, it is to be understood that the second spacer 400 can be formed by any appropriate spacer etch process that does not substantially damage the underlying layers.

As an exemplary illustration, after etching, the second spacer 400 may include a thickness ranging from about 50 angstroms to about 500 angstroms at its base adjacent the substrate 106. However, it is to be understood that the thickness of the second spacer 400 may include without limitation any thickness that is optimized to strategically affect the formation of subsequently formed source and drain regions and/or source and drain contact formations. Accordingly, the thickness the second spacer 400 can be altered to meet the design specifications (e.g., sub 45 nanometer technology node critical dimensions) of the integrated circuit system 100.

Subsequent to etching the second spacer 400, the first liner 402 can be formed. In some embodiments, the first liner 402 can also be formed by an appropriate anisotropic etch process that removes material of the first dielectric layer 200 from over horizontal portions of the substrate 106 and the top of the first device 102 and the second device 104, thereby exposing the gate 110 of the first device 102 and the second device 104.

In other embodiments, the spacer etch process used to form the first liner 402 may include any etch process that can selectively etch the material of the first dielectric layer 200 with respect to the material of the substrate 106, the gate 110, and/or the second spacer 400. However, it is to be understood that the first liner 402 can be formed by any appropriate spacer etch process that does not substantially damage the underlying layers.

As an exemplary illustration, after etching, the base of the first liner 402 adjacent the substrate 106 may extend outward from a vertical portion of the first spacer 116 by an amount substantially equal to the dimension of the second spacer 400, e.g., about 50 angstroms to about 500 angstroms, at its base adjacent the substrate 106.

It is to be understood that the combined thicknesses of the first spacer 116, the first liner 402, and the second spacer 400 may determine, at least in part, the formation of subsequently formed source and drain regions, source and drain contact formations, and/or the proximity of a subsequently deposited stress inducing layer (i.e., a layer that can enhance carrier mobility within the channel region of an active device).

Figure 5:
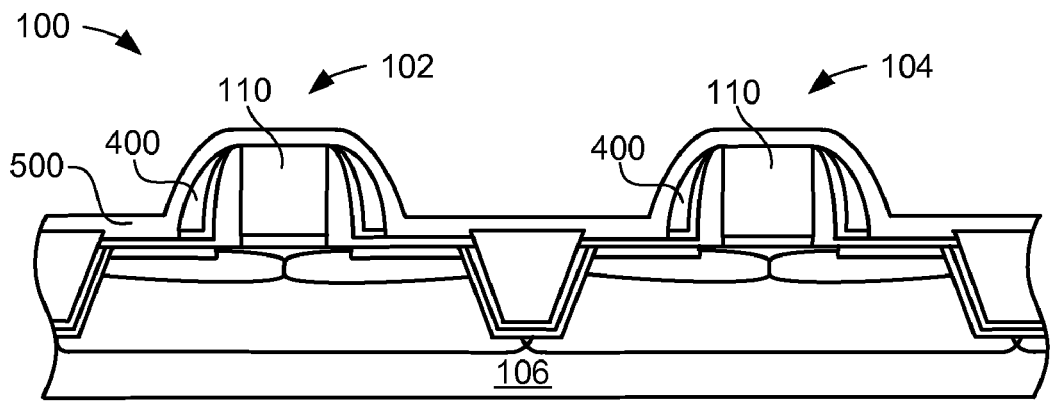
FIG. 5 is the structure of FIG. 4 after forming a second dielectric layer.

Referring now to FIG. 5, therein is shown the structure of FIG. 4 after forming a second dielectric layer 500. The second dielectric layer 500 can be formed over the entirety or on selected portions of the integrated circuit system 100, e.g., blanket deposited over or on the substrate 106, the second spacer 400, and the gate 110, each of the first device 102 and the second device 104. In general, the second dielectric layer 500 can be formed by a variety of techniques, including, but not limited to, chemical vapor deposition and physical vapor deposition.

For example, in some embodiments, the second dielectric layer 500 may include a low temperature oxide film deposited by reacting silane with either oxygen, nitrous oxide, or carbon dioxide at temperatures below about 400° C. in a plasma, when the second spacer 400 includes a thermally decomposable material. For example, at temperatures between about 200° C. and about 400° C., the second dielectric layer 500 can be deposited without causing decomposition of the second spacer 400. In yet other embodiments, the second dielectric layer 500 may include any oxide that is deposited using temperatures, pressures, and reactants that minimizes damage to the second spacer 400 during deposition.

In some embodiments, the second dielectric layer 500 may have a thickness ranging from about 50 angstroms to about 100 angstroms. However, larger or smaller thicknesses of the second dielectric layer 500 may be appropriate depending on the design specifications of the first device 102 and the second device 104. For example, in some embodiments, the second dielectric layer 500 may possess a thickness that protects the second spacer 400 from subsequent process steps, such as resist stripping and wet cleaning.

Figure 6:
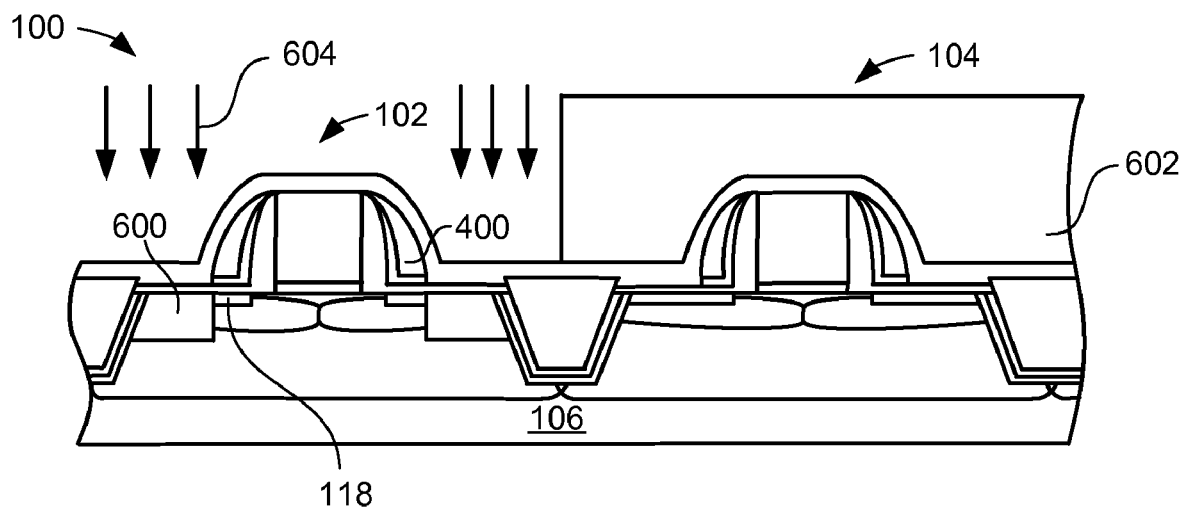
FIG. 6 is the structure of FIG. 5 during formation of a first device source/drain.

Referring now to FIG. 6, therein is shown the structure of FIG. 5 during formation of a first device source/drain 600. A first mask layer 602 is formed over the integrated circuit system 100, and is subsequently patterned to form at least an opening over the first device 102 (i.e., the second device 104 remains covered by the first mask layer 602). However, it is to be understood that the first mask layer 602 could also be formed over the first device 102 and be patterned to form an opening over the second device 104. The material composition of the first mask layer 602 and the patterning techniques used to form an opening within the first mask layer 602 are well known within the art and not repeated herein.

In some embodiments, the first device source/drain 600 can be aligned to the second spacer 400 of the first device 102. In such cases arrows 604 can represent a perpendicular, with respect to the conventional surface of the substrate 106, implant. In other cases, arrows 604 can also represent angled implants, as well. In general, the first device source/drain 600 may be of the same conductivity type as the dopants used to form the source/drain extension 118 of the first device 102 (e.g., n-type impurities for an NFET device or p-type impurities for a PFET device). In a preferred embodiment, the first device source/drain 600 may include p-type implanted impurities.

Subsequent to forming the first device source/drain 600, the first mask layer 602 can be removed and a clean step may be performed to remove remaining surface contaminants. By way of example, in some embodiments, the first mask layer 602 can be removed by a conventional photoresist strip process, followed by a wet clean.

Figure 7:
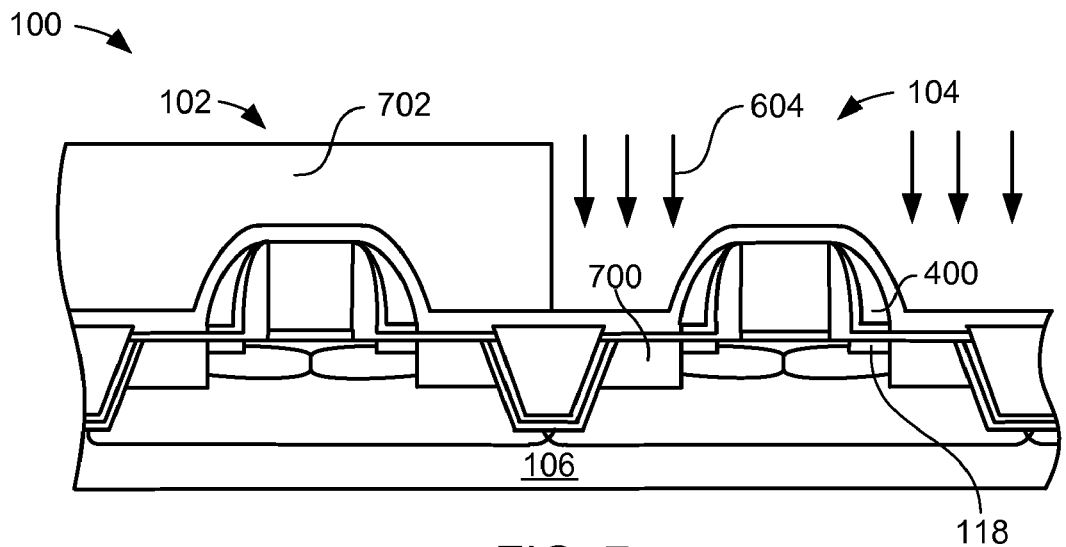
FIG. 7 is the structure of FIG. 6 during formation of a second device source/drain.

Referring now to FIG. 7, therein is shown the structure of FIG. 6 during formation of a second device source/drain 700. A second mask layer 702 is formed over the integrated circuit system 100, and is subsequently patterned to form at least an opening over the second device 104 (i.e., the first device 102 remains covered by the second mask layer 702). The material composition of the second mask layer 702 and the patterning techniques used to form an opening within the second mask layer 702 are well known within the art and not repeated herein.

In some embodiments, the second device source/drain 700 can be aligned to the second spacer 400 of the second device 104. In such cases arrows 604 can represent a perpendicular, with respect to the conventional surface of the substrate 106, implant. In other cases, arrows 604 can also represent angled implants, as well. In general, the second device source/drain 700 may be of the same conductivity type as the dopants used to form the source/drain extension 118 of the second device 104 (e.g., n-type impurities for an NFET device or p-type impurities for a PFET device). In a preferred embodiment, the second device source/drain 700 may include n-type implanted impurities.

Figure 8:
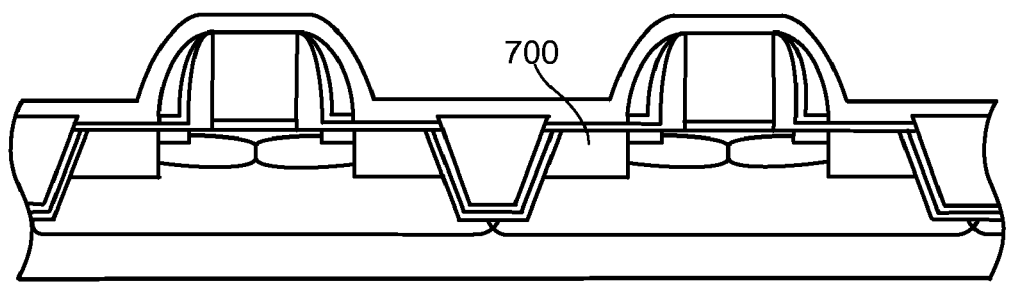
FIG. 8 is the structure of FIG. 7 after removal of a second mask layer.

Referring now to FIG. 8, therein is shown the structure of FIG. 7 after removal of the second mask layer 702, of FIG. 7. Subsequent to forming the second device source/drain 700, the second mask layer 702 can be removed and a clean step may be performed to remove remaining surface contaminants. By way of example, in some embodiments, the second mask layer 702 can be removed by a conventional photoresist strip process, followed by a wet clean.

Figure 9:
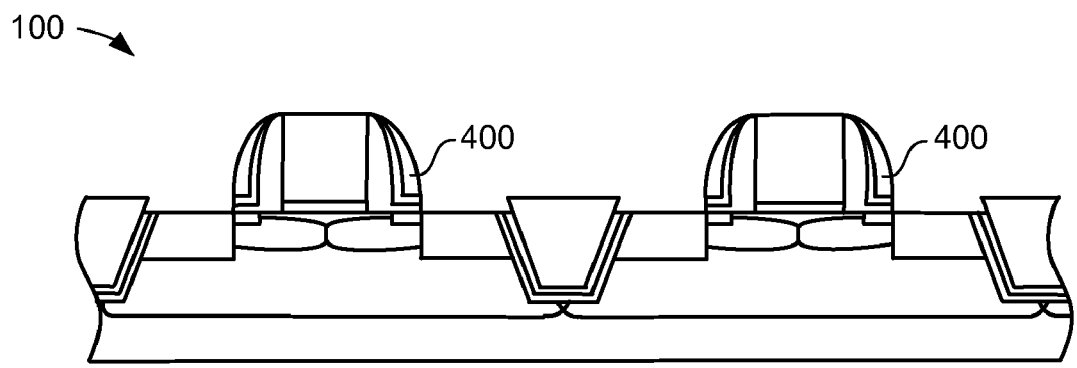
FIG. 9 is the structure of FIG. 8 after removing the second dielectric layer.

Referring now to FIG. 9, therein is shown the structure of FIG. 8 after removing the second dielectric layer 500, of FIG. 5. In general, the second dielectric layer 500 can be etched by common wet or dry etch chemistries. By way of example, in some embodiments, the second dielectric layer 500 and any remaining oxides can be removed by an oxide wet etch, such as a buffered oxide etch or a buffered hydrofluoric acid etch. Notably, by controlling through etch time, damage to the substrate 106 can be minimized. However, it is to be understood that the type of etch chemistry used to etch the second dielectric layer 500 is not essential, what is important is that the second dielectric layer 500 is removed from over the integrated circuit system 100, thereby exposing the second spacer 400.

Figure 10:
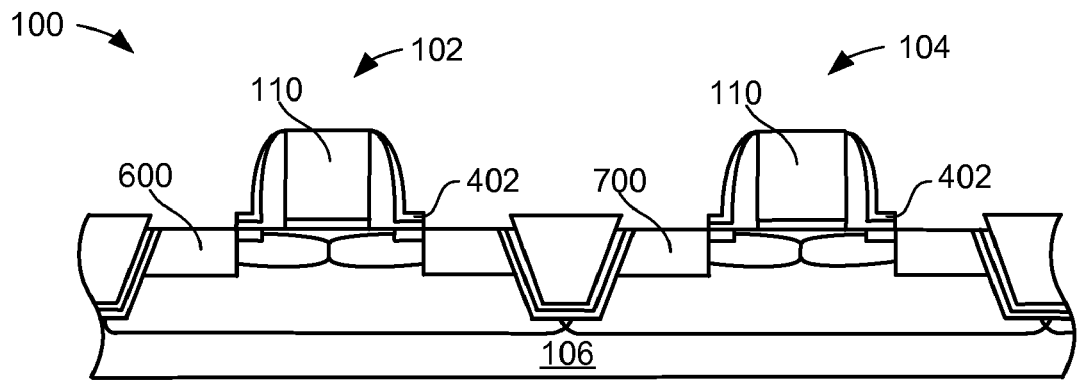
FIG. 10 is the structure of FIG. 9 after removing the second spacer.

Referring now to FIG. 10, therein is shown the structure of FIG. 9 after removing the second spacer 400, of FIG. 9. In some embodiments, if the second spacer 400 includes an amorphous carbon, the second spacer 400 can be removed by an ashing process employing an in-situ or remote $O_2$ plasma. However, it is to be understood that other etching processes may be employed to remove the second spacer 400, these etching processes only being limited by their ability to prevent damage to the material of the first liner 402, the material of the substrate 106, and/or the material of the gate 110. Notably, by employing such etching processes, there is minimal damage to silicon containing regions of the integrated circuit system 100, thereby maintaining the integrity of the active regions of the first device 102 and the second device 104.

In other embodiments, the second spacer 400 can be removed by a thermal process that can selectively etch the material of the second spacer 400, without limitation, with respect to the material of the first liner 402, the material of the substrate 106, and/or the material of the gate 110. By way of example, if the second spacer 400 includes a thermally decomposable material, then the thermal process may include heating the integrated circuit system 100 to a temperature not to exceed about 500° C.

However, it is to be understood that higher or lower temperatures may be appropriate depending on the material of the second spacer 400. Notably, by employing such thermal etching processes, there is minimal damage to silicon containing regions and/or silicide containing regions of the integrated circuit system 100, thereby maintaining the integrity of the active regions of the first device 102 and the second device 104.

Additionally, it is to be noted that the etching processes employed to remove the second spacer 400 do not substantially harm the first liner 402, thereby allowing such structure to define in part the boundaries of a subsequent deposition of a low resistance electrical contact, such as a silicide or salicide contact, to the first device source/drain 600 and the second device source/drain 700.

Moreover, it is to be noted that the removal of the second spacer 400 helps to decrease the stress on the underlying material of the substrate 106, thereby reducing the likelihood of silicide piping problems.

Figure 11:
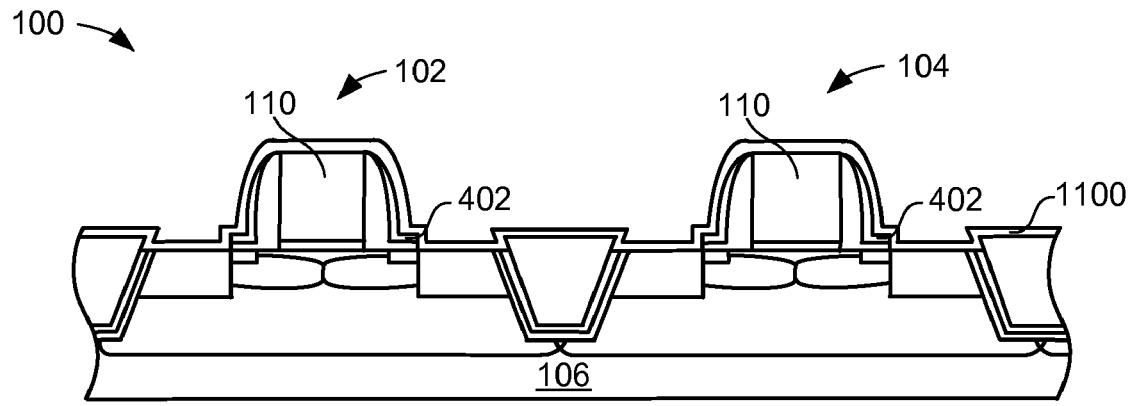
FIG. 11 is the structure of FIG. 10 after forming a third dielectric layer.

Referring now to FIG. 11, therein is shown the structure of FIG. 10 after forming a third dielectric layer 1100. The third dielectric layer 1100 can be formed over or on the entirety or selected portions of the integrated circuit system 100, e.g., blanket deposited over or on the substrate 106, the first liner 402, and the gate 110, each of the first device 102 and the second device 104. In general, the third dielectric layer 1100 can be formed by a variety of techniques, including, but not limited to, chemical vapor deposition and physical vapor deposition.

For example, in some embodiments, the third dielectric layer 1100 may include a low temperature oxide film deposited by reacting silane with either oxygen, nitrous oxide, or carbon dioxide at temperatures around about 400° C. in a plasma. In still yet other embodiments, the third dielectric layer 1100 may include any oxide that is deposited using temperatures, pressures, and reactants that prevents or minimizes the out-diffusing of dopants from the substrate 106 and/or the gate 110, for example.

In some embodiments, the third dielectric layer 1100 may have a thickness ranging from about 40 angstroms to about 100 angstroms. However, larger or smaller thicknesses of the third dielectric layer 1100 may be appropriate depending on the design specifications of the first device 102 and the second device 104.

In some embodiments, subsequent to forming the third dielectric layer 1100, an anneal may be performed. It is to be understood that the anneal may include, for example, any thermal process that causes electrical activation of the dopants within the first device 102, the second device 104 and/or the substrate 106. As exemplary illustrations, the anneal may include a rapid thermal anneal, a spike anneal, a millisecond anneal, a flash anneal, and/or a laser anneal. In some embodiments, the third dielectric layer 1100 may help to prevent or minimize the out-diffusing of dopants from the substrate 106 and/or the gate 110 during the above anneal.

Figure 12:
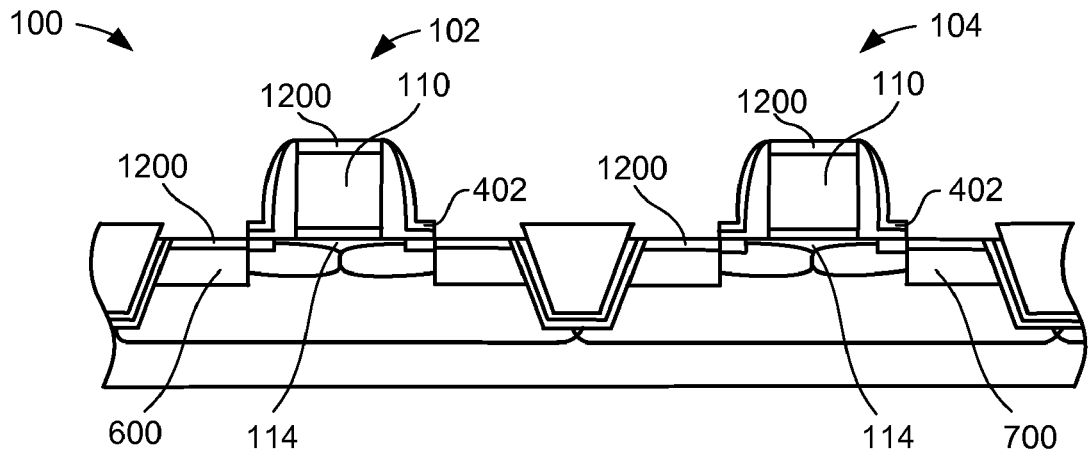
FIG. 12 is the structure of FIG. 11 after forming an electrical contact.

Referring now to FIG. 12, therein is shown the structure of FIG. 11 after forming an electrical contact 1200. Prior to forming the electrical contact 1200, it is to be understood that a conventional silicide blocking mask layer (not shown) can be formed over selected portions of the integrated circuit system 100, thereby preventing deposition of the electrical contact 1200 in selected regions. Subsequent to forming the silicide blocking mask layer, the third dielectric layer 1100, of FIG. 11, can be selectively removed by conventional wet or dry etch chemistries and the integrated circuit system 100 may also undergo a cleaning step to remove surface contaminants, such as particles, mobile ionic contaminants, organics and native oxides, before formation of the electrical contact 1200.

The electrical contact 1200, such as a low resistance silicide or salicide electrical contact, can be formed over the gate 110 and adjacent the first liner 402 (e.g., over at least a portion of the first device source/drain 600 and the second device source/drain 700) of the first device 102 and the second device 104. In some embodiments, the electrical contact 1200 may include any conducting compound that forms an electrical interface between itself and another material that is thermally stable and provides uniform electrical properties with low resistance. In other embodiments, the electrical contact 1200 may include refractory metal materials such as, nickel (Ni), tantalum (Ta), cobalt (Co), titanium (Ti), tungsten (W), platinum (Pt), or molybdenum (Mo). In yet other embodiments, the electrical contact 1200 formed over a portion of the first device source/drain 600 and the second device source/drain 700 can be aligned to the first liner 402 via a salicide process.

It will be appreciated by those skilled in the art that the electrical contact 1200 can affect the mobility of carriers (e.g., due to stresses imparted by the electrical contact 1200) within the channel 114 of either the first device 102 or the second device 104. For example, in cases where the first device 102 includes a PFET device, if the electrical contact 1200 is placed too close to the channel 114 of the first device 102, the electrical contact 1200 can detrimentally affect the mobility of carriers within the channel 114. As such, if the first device 102 is a PFET device, it is to be understood that the dimensions of the first liner 402 can be modulated to reduce or negate the detrimental effect that the electrical contact 1200 can have on carrier mobility within the channel 114 of the first device 102. Alternatively, the dimensions of the first liner 402 can also be modulated to enhance the effect that the electrical contact 1200 can have on carrier mobility within the channel 114 of the second device 104, if the second device 104 is an NFET device. Accordingly, the dimensions of the first liner 402 can be modulated to enhance or reduce the effects that the electrical contact 1200 could have on the stress level within the first device 102 and the stress level within the second device 104.

Figure 13:
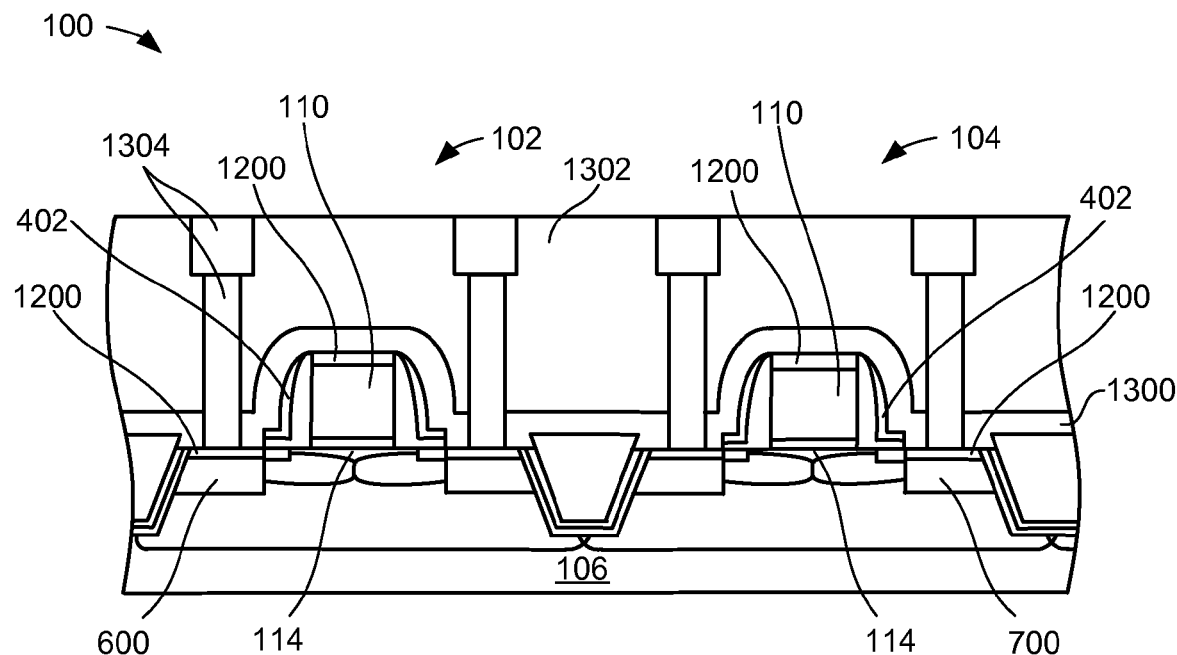
FIG. 13 is the structure of FIG. 12 after further processing.

Referring now to FIG. 13, therein is shown the structure of FIG. 12 after further processing. Subsequent to forming the electrical contact 1200, a fourth dielectric layer 1300 is deposited over the entirety or on selected portions of the integrated circuit system 100, e.g., blanket deposited over or on the substrate 106, the electrical contact 1200, the first liner 402, and the gate 110, each of the first device 102 and the second device 104. In general, the fourth dielectric layer 1300 can be formed by a variety of techniques, including, but not limited to, chemical vapor deposition and physical vapor deposition.

In some embodiments, the fourth dielectric layer 1300 may include an insulating material such as a nitride deposited by low pressure chemical vapor deposition (LPCVD) or plasma enhanced chemical vapor deposition (PECVD). In other embodiments, the fourth dielectric layer 1300 may include a silicon nitride film deposited by rapid thermal chemical vapor deposition (RTCVD). In general, the fourth dielectric layer 1300 may have a thickness ranging from about 100 angstroms to about 800 angstroms. However, larger or smaller thicknesses may be employed depending upon the design specifications of the first device 102 and the second device 104.

In yet other embodiments, the fourth dielectric layer 1300, such as a stress inducing layer, may include any material that transfers its inherent or intrinsic stress to the channel 114 of the first device 102 and/or the second device 104. By way of example, the fourth dielectric layer 1300 may include a compressively stressed layer, a tensile stressed layer, or a combination thereof (e.g., tensile for NFET and compressive for PFET). It will be appreciated by those skilled in the art that an appropriately applied stress to the channel region of an active device by a stress inducing layer will enhance the carrier mobility within the channel region, thereby improving device performance.

It is to be understood that the stress induced within the first device 102 and/or the second device 104 by the fourth dielectric layer 1300 can be increased by altering the intrinsic stress within the fourth dielectric layer 1300. For example, a multitude of deposition parameters, such as reactant flow rates, pressure, temperature, RF power, reactant materials, and thickness, can be adjusted to modulate the intrinsic stress within the fourth dielectric layer 1300 and thereby maximize its stress transference effect upon the first device 102 and/or the second device 104. In an embodiment, the fourth dielectric layer 1300 may include a tensile stressed silicon nitride layer deposited by a plasma enhanced chemical vapor deposition process.

Notably, by removing the second spacer 400, of FIG. 9, the fourth dielectric layer 1300 can be placed in closer proximity (e.g., proximate or adjacent) to the channel 114 of the first device 102 and the second device 104, thereby enhancing (e.g., by improving carrier mobility) the affect of the stress level induced by the fourth dielectric layer 1300.

Additionally, it is to be noted that the removal of the second spacer 400 helps to increase the dense area spacing between the gate 110 of the first device 102 and the second device 104, thereby improving the bottom step coverage of the fourth dielectric layer 1300, which will help to boost up and/or increase the strain effect from the fourth dielectric layer 1300 (e.g., a tensile stressed SiN) in dense areas.

Moreover, it will be appreciated by those skilled in the art that the remainder of the integrated circuit system 100 can then be completed by conventional transistor and/or CMOS process steps, such as, but not limited to, formation of a fifth dielectric 1302 followed by masking and etching of the fifth dielectric 1302 to form a contact 1304 between each of the first device source/drain 600 and the second device source/drain 700 and a metal-1 interconnect (not shown).

Figure 14:
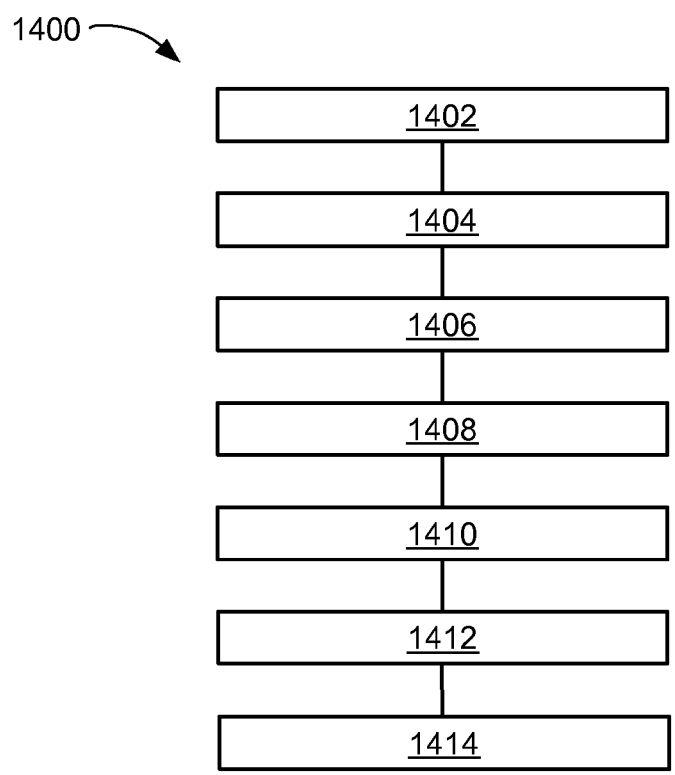
FIG. 14 is a flow chart of an integrated circuit system for an integrated circuit system in accordance with an embodiment of the present invention.

Referring now to FIG. 14, therein is shown a flow chart of an integrated circuit system 1400 for the integrated circuit system 100 in accordance with an embodiment of the present invention. The integrated circuit system 1400 includes providing a substrate including a first device and a second device in a block 1402; configuring the first device and the second device to include a first spacer, a first liner made from a first dielectric layer, and a second spacer made from a sacrificial spacer material in a block 1404; forming a second dielectric layer over the integrated circuit system in a block 1406; forming a first device source/drain and a second device source/drain adjacent the second spacer and through the second dielectric layer in a block 1408; removing the second spacer without damaging the substrate in a block 1410; forming a third dielectric layer over the integrated circuit system before annealing in a block 1412; and forming a fourth dielectric layer over the integrated circuit system that promotes stress within the channel of the first device, the second device, or a combination thereof in a block 1414.

It has been discovered that the present embodiments thus has numerous aspects. One such aspect is that the present embodiments permit the removal of a spacer without damaging the active silicon or silicide regions on a substrate.

Another aspect is that the present embodiments increase the dense area spacing between poly lines of adjacent gate structures.

Another aspect of the present embodiments is that they improve step coverage of stress inducing layers and pre-metallization dielectrics formed between the poly lines of adjacent gate structures.

Another aspect of the present embodiments is that the techniques taught here within will reduce the variation in thickness of stress inducing layers deposited in dense and in isolated areas, thereby helping to reduce the variation in Ion/Ioff performance between isolated and dense structures.

Another aspect of the present embodiments is that a stress inducing layer can be deposited in closer proximity to an active device channel due to the removal of a second spacer, thereby improving carrier mobility and device performance.

Another aspect of the present embodiments is that the techniques taught here within provide an easy integration solution with a big process margin for formation of a sacrificial spacer.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for enhancing NFET and PFET device performance. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit system comprising:
providing a substrate including a first device and a second device;
configuring the first device and the second device to include a first spacer, a first liner made from a first dielectric layer, and a second spacer made from a sacrificial spacer material;
forming a second dielectric layer over the integrated circuit system;
forming a first device source/drain and a second device source/drain adjacent the second spacer and through the second dielectric layer;
removing the second spacer without damaging the substrate;
forming a third dielectric layer over the integrated circuit system before annealing; and
forming a fourth dielectric layer over the integrated circuit system that promotes stress within the channel of the first device, the second device, or a combination thereof.

2. The system as claimed in claim 1 wherein:
configuring the first device and the second device to include the second spacer made from a sacrificial spacer material includes the second spacer made from amorphous carbon or a thermally decomposable material.

3. The system as claimed in claim 1 wherein:
removing the second spacer without damaging the substrate includes an ashing etch process or a thermal etch process.

4. The system as claimed in claim 1 wherein:
forming the second dielectric layer protects the second spacer.

5. The system as claimed in claim 1 wherein:
forming the fourth dielectric layer includes forming a tensile or compressive stress inducing layer.

6. An integrated circuit system comprising:
providing a substrate including a first device;
configuring the first device to include a first spacer, a first liner and a second spacer made from a thermally decomposable material;
forming a first device source/drain;
removing the second spacer; and
forming an electrical contact adjacent the first liner.

7. The system as claimed in claim 6 wherein:
providing the first device includes providing a PFET device or an NFET device.

8. The system as claimed in claim 6 wherein:
removing the second spacer includes removing the second spacer by a thermal etch process.

9. The system as claimed in claim 6 wherein:
removing the second spacer prevents silicide piping from the electrical contact.

10. The system as claimed in claim 6 wherein:
removing the second spacer allows a stress inducing layer to be placed adjacent a channel of the first device.

11. An integrated circuit system comprising:
providing a substrate including a first device and a second device;
configuring the first device and the second device to include a first spacer, a first liner and a second spacer made from a thermally decomposable material;
forming a first device source/drain and a second device source/drain;
removing the second spacer; and
forming an electrical contact adjacent the first liner of the first device and the second device.

12. The system as claimed in claim 11 wherein:
configuring the first device and the second device to include the second spacer made from the thermally decomposable material includes the second spacer made from a hydrocarbon-siloxane polymer hyrbrid.

13. The system as claimed in claim 11 wherein:
removing the second spacer includes removing the second spacer via a thermal etch process that does not damage the substrate.

14. The system as claimed in claim 11 further comprising:
forming a second dielectric layer to protect the second spacer.

15. The system as claimed in claim 11 further comprising:
forming a stress inducing layer over the integrated circuit system that promotes stress within the channel of the first device, the second device, or a combination thereof.

16. The system as claimed in claim 11 wherein:
removing the second spacer prevents silicide piping from the electrical contact.

17. The system as claimed in claim 11 wherein:
providing the first device includes providing a PFET device and providing the second device includes providing an NFET device.

18. The system as claimed in claim 11 wherein:
removing the second spacer allows a stress inducing layer to be placed adjacent a channel of the first device, the second device, or a combination thereof.

19. The system as claimed in claim 11 further comprising:
forming a third dielectric layer over the integrated circuit system to prevent out-diffusion of dopants during annealing.

20. The system as claimed in claim 11 further comprising:
forming a source/drain extension and a halo region for each of the first device and the second device.

* * * * *